United States Patent
Sasaki et al.

(10) Patent No.: US 10,544,334 B2
(45) Date of Patent: Jan. 28, 2020

(54) HEAT CONDUCTIVE PASTE AND METHOD FOR PRODUCING THE SAME

(71) Applicant: NAMICS CORPORATION, Niigata-shi, Niigata (JP)

(72) Inventors: Koji Sasaki, Niigata (JP); Hiroki Maruyama, Niigata (JP)

(73) Assignee: NAMICS CORPORATION, Tokyo (JP)

( * ) Notice: Subject to any disclaimer, the term of this patent is extended or adjusted under 35 U.S.C. 154(b) by 2 days.

(21) Appl. No.: 15/548,614

(22) PCT Filed: Feb. 1, 2016

(86) PCT No.: PCT/JP2016/052900
§ 371 (c)(1),
(2) Date: Aug. 3, 2017

(87) PCT Pub. No.: WO2016/125737
PCT Pub. Date: Aug. 11, 2016

(65) Prior Publication Data
US 2018/0002576 A1    Jan. 4, 2018

(30) Foreign Application Priority Data

Feb. 4, 2015    (JP) ................................ 2015-020219

(51) Int. Cl.
| | | |
|---|---|---|
| C09J 9/02 | (2006.01) | |
| C09J 11/06 | (2006.01) | |
| C09J 1/00 | (2006.01) | |
| H01L 21/52 | (2006.01) | |
| H01B 1/22 | (2006.01) | |

(52) U.S. Cl.
CPC .  *C09J 9/02* (2013.01); *C09J 1/00* (2013.01); *C09J 11/06* (2013.01); *H01B 1/22* (2013.01); *H01L 21/52* (2013.01); *C09J 2400/16* (2013.01)

(58) Field of Classification Search
None
See application file for complete search history.

(56) References Cited

U.S. PATENT DOCUMENTS

| | | | | |
|---|---|---|---|---|
| 2009/0242854 A1* | 10/2009 | Li | ........................ | C09D 11/101 252/519.33 |
| 2011/0180764 A1* | 7/2011 | Takahashi | ............. | B22F 1/0018 252/514 |
| 2012/0085579 A1* | 4/2012 | Tatsuzawa | ............. | H05K 3/323 174/84 R |
| 2016/0009976 A1* | 1/2016 | Hui | .......................... | C09J 11/04 252/74 |
| 2017/0077057 A1* | 3/2017 | Endoh | ....................... | B22F 1/00 |

FOREIGN PATENT DOCUMENTS

| | | |
|---|---|---|
| JP | 10050143 A | 2/1998 |
| JP | 2007100062 A | 4/2007 |
| JP | 2009070677 A | 4/2009 |
| JP | 2010123355 A | 6/2010 |
| JP | 2010132736 A | 6/2010 |
| JP | 2010257958 A | 11/2010 |
| JP | 2012072364 A | 4/2012 |
| JP | 2013214733 A | 10/2013 |
| JP | 2014055332 A | 3/2014 |
| WO | 2012133767 A1 | 10/2012 |

OTHER PUBLICATIONS

English text machine translation of Namics Corporation (WO 2012/133767 A1) for equivalent publication JP 5872545, accessed from Espacenet, copy attached as a PDF, also includes WO doc. bibliographic data page. (Year: 2012).*

English text machine translation of Suenaga et al. (JP 2007-100062 A), accessed from the Espacenet website, copy attached as a PDF. (Year: 2007).*

International Search Report (ISR) and Written Opinion dated Apr. 19, 2016 issued in International Application No. PCT/JP2016/052900.

Extended European Search Report (EESR) dated Aug. 10, 2018 issued in counterpart European Application No. 16746568.1.

* cited by examiner

*Primary Examiner* — Katie L. Hammer

(74) *Attorney, Agent, or Firm* — Holtz, Holtz & Volek PC

(57) ABSTRACT

A heat conductive paste including silver fine particles having an average particle diameter of primary particles of 40 to 350 nm, a crystallite diameter of 20 to 70 nm, and a ratio of the average particle diameter to the crystallite diameter of 1 to 5, an aliphatic primary amine and a compound having at least one phosphoric acid group. The heat conductive paste includes 1 to 40 parts by mass of the aliphatic primary amine and 0.001 to 2 parts by mass of the compound having at least one phosphoric acid group based on 100 parts by mass of the silver fine particles. The heat conductive paste has a high conductivity.

18 Claims, No Drawings

HEAT CONDUCTIVE PASTE AND METHOD FOR PRODUCING THE SAME

TECHNICAL FIELD

The present invention relates to a heat conductive paste, in particular, to a heat conductive paste for a die attach or forming a bump of a semiconductor device. The present invention also relates to a semiconductor device which uses the heat conductive paste for bonding parts.

BACKGROUND ART

A conductive paste containing silver particles has been used for forming electrode or a circuit pattern of an electronic part. Such a conductive paste has been used, for example, for a conductive circuit on a printed circuit board, an electrode of a capacitor, etc. As such a conductive paste, a conductive paste containing an amine salt of phosphoric acid with conductive metallic particles to improve preservation stability or dispersibility of the metallic particles in an organic solvent of the paste has been proposed (Patent Document 1).

In addition, as a conductive paste, a conductive paste containing metallic particles and a surfactant having a phosphoric acid group has been proposed to improve dispersibility of the metallic particles (Patent Documents 2 to 6). These conductive pastes are to suppress aggregation of the metallic particles in the conductive paste by attaching the phosphoric acid group contained in the surfactant to the metallic particles having high reductivity, and covering the surfaces of the metallic particles by the surfactant having the phosphoric acid group as a protective substance.

In recent years, in addition to polyimide flexible circuit boards, there is a movement to use an inexpensive PET (polyethylene terephthalate) film, PEN (polyethylene naphthalate) film, etc., as a substrate in the fields including mobile phones. In the field of using these substrates, a paste capable of being sintered at a low temperature of 300° C. or lower, more preferably 200° C. or lower is required. Under such circumstances, in recent years, a paste using silver fine particles which can be sintered at a relatively low temperature has been desired to be used in not only a conductive paste but also in a thermally conductive paste usable as a bonding member in a semiconductor device such as a bump and a die attachment member, etc.,.

PRIOR ART DOCUMENTS

Patent Documents

Patent Document 1: JP Hei. 10-50143A
Patent Document 2: JP 2009-70677A
Patent Document 3: JP 2010-123355A
Patent Document 4: JP 2010-132736A
Patent Document 5: JP 2010-257958A
Patent Document 6: JP 2007-100062A

SUMMARY OF THE INVENTION

Problems to be Solved by the Invention

An object of the present invention is, in response to the above-mentioned situation, to provide a heat conductive paste having high conductivity as well as improved in thermal conductivity by using silver fine particles, while satisfying the requirement of low temperature sintering at 300° C. or lower, more preferably 200° C. or lower, and method for producing the same.

Means to Solve the Problems

The present invention 1 relates to a heat conductive paste which comprises silver fine particles having an average particle diameter of primary particles of 40 to 350 nm, a crystallite diameter of 20 to 70 nm, and a ratio of the average particle diameter to the crystallite diameter of 1 to 5, an aliphatic primary amine, and a compound having a phosphoric acid group(s).

The present invention 2 relates to the heat conductive paste of the present invention 1, wherein the paste contains 1 to 40 parts by mass of the aliphatic primary amine and 0.001 to 2 parts by mass of the compound having a phosphoric acid group(s) based on 100 parts by mass of the silver fine particles.

The present invention 3 relates to a heat conductive paste obtainable by mixing a silver salt of a carboxylic acid and an aliphatic primary amine, then, adding a reducing agent thereto, and mixing a compound having a phosphoric acid group(s) with a reaction mixture containing the silver fine particles obtainable by reacting these.

The present invention 4 relates to the heat conductive paste of the present invention 3, wherein the reaction mixture contains 1 to 40 parts by mass of the aliphatic primary amine based on 100 parts by mass of the silver fine particles, and obtainable by mixing 0.001 to 2 parts by mass of the compound having a phosphoric acid group(s) with the reaction mixture The present invention 5 relates to the heat conductive paste described in any of the present inventions 1 to 4, wherein the compound having a phosphoric acid group(s) is at least one kind selected from the group consisting of phosphoric acid, pyrophosphoric acid, polyphosphoric acid and a phosphoric acid salt thereof, and a phosphoric acid-based surfactant.

The present invention 6 relates to the heat conductive paste described in any of the present inventions 1 to 4, wherein the compound having a phosphoric acid group(s) is a compound represented by the formula (I):

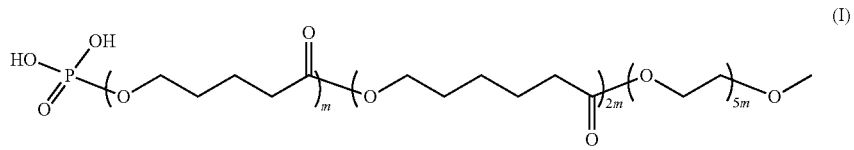

(wherein m is 1 to 10.).

The present invention 7 relates to the heat conductive paste described in any of the present inventions 1 to 6, wherein the aliphatic primary amine is at least one kind of an aliphatic primary amine selected from the group consisting of 2-methoxyethylamine, 3-methoxypropylamine, 3-ethoxypropylamine and 1,2-diaminocyclohexane.

The present invention 8 relates to the heat conductive paste described in any of the present inventions 1 to 6, wherein the aliphatic primary amine is at least one kind of an aliphatic primary amine selected from the group consisting of 3-methoxypropylamine and 1,2-diaminocyclohexane.

The present invention 9 relates to the heat conductive paste described in any of the present inventions 3 to 8, wherein the reducing agent is at least one kind of a reducing agent selected from the group consisting of formic acid, formaldehyde, ascorbic acid and hydrazine.

The present invention 10 relates to the heat conductive paste described in any of the present inventions 3 to 9, wherein the silver salt of a carboxylic acid is at least one kind of a silver salt of a carboxylic acid selected from the group consisting of acetic acid and propionic acid.

The present invention 11 relates to the heat conductive paste described in any of the present inventions 1 to 10, which is for die attachment of a semiconductor device.

The present invention 12 relates to the heat conductive paste described in any of the present inventions 1 to 10, which is for formation of a bump of a semiconductor device.

The present invention 13 relates to a semiconductor device which uses the heat conductive paste described in any of the present inventions 1 to 12 for bonding parts.

The present invention 14 relates to a method for producing a heat conductive paste which comprises the steps of (1) a step of mixing a silver salt of a carboxylic acid and an aliphatic primary amine, (2) a step of adding a reducing agent to the mixture to react these materials at a reaction temperature of 20 to 80° C., (3) a step of separating layers of the reaction mixture and recovering a layer containing the silver fine particles, and (4) a step of mixing a compound having a phosphoric acid group(s) with the layer containing the recovered silver fine particles.

The present invention 15 relates to the method for producing a heat conductive paste described in the present invention 14, wherein the paste contains 1 to 40 parts by mass of the aliphatic primary amine and 0.001 to 2 parts by mass of the compound having a phosphoric acid group(s) based on 100 parts by mass of the silver fine particles.

Effects of the Invention

The heat conductive paste of the present invention can improve applicability to a substrate by maintaining stability thereof. The heat conductive paste of the present invention is secured denseness or surface smoothness of the silver film at the time of sintering at a sintering temperature of 300° C. or lower, preferably 200° C. or lower, for example, at 120 to 180° C., and a silver film showing sufficient high conductivity and high thermal conductivity (for example, electric resistivity (specific resistance) of less than 10 μΩ·cm, and thermal conductivity of 65 W/m·K or more) can be formed. In addition, the heat conductive paste of the present invention is improved in sinterability even in the silver fine particles having a small average particle diameter, whereby it can respond to the demand of excellent thermal conductivity sufficiently. According to the present invention, the heat conductive paste can be used as a heat conductive paste for die attachment or totaling bumps. In addition, in the present invention, the heat conductive paste is used for bonding parts to obtain a semiconductor device.

EMBODIMENTS TO CARRY OUT THE INVENTION

The present invention is directed to a heat conductive paste comprising silver fine particles having an average particle diameter of primary particles of 40 to 350 nm, a crystallite diameter of 20 to 70 nm, and a ratio of the average particle diameter to the crystallite diameter of 1 to 5, an aliphatic primary amine and a compound having a phosphoric acid group(s). In the present specification, the silver fine particles having an average particle diameter of primary particles of 40 to 350 nm, a crystallite diameter of 20 to 70 nm, and a ratio of the average particle diameter to the crystallite diameter of 1 to 5 are referred to silver fine particles having specific particle characteristics.

In the present specification, the average particle diameter of the silver fine particles is measured by using FE-SEM (JSM7500F) manufactured by JEOL Ltd., obtaining an arithmetic mean value of diameter of 300 particles arbitrarily selected, and making the value the average particle diameter. Also, in the present specification, the crystallite diameter is a result of the measurement of a powder X-ray diffraction method using a Kα ray of Cu as a radiation source to obtain a half value width of the plane index (1,1,1) plane and calculation by using the Scherrer's formula.

The silver fine particles to be used in the present invention have an average particle diameter of primary particles of 40 to 350 nm, preferably 50 to 200 nm, more preferably 60 to 180 nm. The silver fine particles to be used in the present invention generally have substantially spherical shape. If the silver fine particles have an average particle diameter of the primary particles of 40 to 350 nm, aggregation of the silver fine particles is suppressed, and when they were made a paste, preservation stability can be easily obtained. In addition, a sintered film of the silver fine particles, which can ensure excellent thermal conductivity, and excellent in denseness and surface smoothness can be obtained, so that it is also suitable as a starting material of a heat conductive paste.

The silver fine particles to be used in the present invention have a crystallite diameter of 20 to 70 nm, preferably 20 to 50 nm. If the silver fine particles have the crystallite diameter of 20 to 70 nm, volume shrinkage at the time of sintering is suppressed, as well as denseness or surface smoothness of the silver film formed after sintering is ensured, and excellent thermal conductivity can be obtained, so that these are also suitable as a starting material of a heat conductive paste to be used for a bonding member, etc., of electronic parts.

The silver fine particles to be used in the present invention have a ratio of an average particle diameter of the primary particles to a crystallite diameter of the primary particles (average particle diameter/crystallite diameter) of 1 to 5, preferably 1.5 to 4.5, more preferably in the range of 2 to 4. If the silver fine particles have a ratio of an average particle diameter of the primary particles to a crystallite diameter of the primary particles (average particle diameter/crystallite diameter) of 1 to 5, it is suitable for a starting material of a heat conductive paste showing sufficient thermal conductivity while securing denseness and smoothness of the resulting heat conductive film (a silver film) obtained at a sintering temperature of 300° C. or lower, preferably 200° C. or lower, more preferably lower than 180° C., particularly preferably a sintering temperature of 120 to 180° C.

The silver fine particles to be used in the present invention can be produced by mixing a silver salt of a carboxylic acid and an aliphatic primary amine, then, a reducing agent is added thereto and the mixture is reacted to precipitate the silver fine particles. A temperature to be carried out the reaction is preferably 20 to 80° C.

First, the silver salt of a carboxylic acid and the aliphatic primary amine are mixed to obtain a solution in which the silver salt of a carboxylic acid is dissolved. In the solution, the aliphatic primary amine is coordinated to the silver salt of a carboxylic acid and a kind of an amine complex is considered to be formed.

The silver salt of a carboxylic acid is preferably at least one kind of a silver salt of a carboxylic acid selected from the group consisting of silver acetate and silver propionate, more preferably silver acetate. These may be used alone or two or more kinds in combination.

The aliphatic primary amine to be mixed with the silver salt of a carboxylic acid may be a linear aliphatic primary amine or a cyclic aliphatic primary amine. The aliphatic primary amine contained in the reaction mixture which contains the silver fine particles obtained by mixing the silver salt of a carboxylic acid and the aliphatic primary amine, and then, adding a reducing agent and reacting these may be the same kind of the aliphatic primary amine as the aliphatic primary amine contained in the heat conductive paste or may be different kind of the aliphatic primary amine. In addition, the aliphatic primary amine may be a monoamine compound or a polyamine compound such as a diamine compound, etc. The aliphatic primary amine also includes those in which the aliphatic hydrocarbon group has been substituted by a hydroxyl group, an alkoxy group such as a methoxy group, an ethoxy group, a propoxy group, etc. The aliphatic primary amine is more preferably at least one kind selected from the group consisting of 2-methoxyethylamine, 3-methoxypropylamine, 3-ethoxypropylamine, 3-aminopropanol and 1,2-diaminocyclohexane. The aliphatic primary amine is further preferably at least one kind selected from the group consisting of 2-methoxyethylamine, 3-methoxypropylamine, 3-ethoxypropylamine and 1,2-diaminocyclohexane. The aliphatic primary amine is furthermore preferably at least one kind selected from the group consisting of 3-methoxypropylamine and 1,2-diaminocyclohexane. The aliphatic primary amine is particularly preferably 3-methoxypropylamine. These may be used alone, or may be used two or more kinds in combination.

A used amount of the aliphatic primary amine to be mixed with the silver salt of a carboxylic acid is determined by the requirements on the process such as the post-treatment of the produced silver fine particles, etc., and by the apparatus, and from the point of obtaining the silver fine particles having controlled particle diameter, the amino group in the aliphatic primary amine is preferably 1 equivalent or more based on 1 equivalent of the carboxylic acid in the silver salt of a carboxylic acid. In addition, even when the excessive aliphatic primary amine is present, the silver fine particles can be produced stably but a released amount of the amine to the environment is increased, so that the amino group in the aliphatic primary amine is preferably 3.0 equivalent or less, more preferably 2.0 equivalent or less, particularly preferably 1.6 equivalent or less. In particular, when a liquid in which the silver fine particles are precipitated by adding a reducing agent is directly used as the heat conductive paste in the subsequent step, there is a possibility that the excessive aliphatic primary amine is vaporized by heating, so that it is particularly desired to employ the preferred used range in which the amino group in the aliphatic primary amine is 1 equivalent or more based on 1 equivalent of the carboxylic acid in the silver salt of a carboxylic acid.

Mixing of the silver salt of a carboxylic acid and the aliphatic primary amine may be carried out in the absence of or in the presence of an organic solvent. By using the organic solvent, mixing can be made easily. The organic solvent may be an alcohol such as ethanol, propanol, butanol, etc., an ether such as propylene glycol dibutyl ether, etc., and an aromatic hydrocarbon such as toluene, etc. These may be used alone, or may be used two or more kinds in combination. An amount of the organic solvent to be used may be made an optional amount in the points of convenience of the mixing and productivity of the silver fine particles in the subsequent step.

Mixing of the silver salt of a carboxylic acid and the aliphatic primary amine is carried out, for example, by adding the silver salt of a carboxylic acid to the aliphatic primary amine or a mixture of the aliphatic primary amine and an organic solvent under stirring. Stirring may be optionally continued after completion of the addition. During the stirring, it is preferred to maintain the temperature of the mixture to 20 to 80° C., more preferably 20 to 60° C.

Thereafter, a reducing agent is added to the mixture to precipitate the silver fine particles. The reducing agent is preferably at least one kind of a reducing agent selected from the group consisting of formic acid, formaldehyde, ascorbic acid and hydrazine in the point of controlling the reaction, more preferably formic acid. These may be used alone, or may be used two or more kinds in combination.

An amount of the reducing agent to be used is generally an oxidation-reduction equivalent or more based on the silver salt of a carboxylic acid, and the oxidation-reduction equivalent is preferably 0.5 to 5-fold, more preferably 1 to 3-fold. When the silver salt of a carboxylic acid is a silver salt of a monocarboxylic acid and formic acid is used as the reducing agent, an amount of the formic acid to be used in terms of mol is preferably 0.25 to 2.5 mol based on 1 mol of the silver salt of a carboxylic acid, more preferably 0.5 to 1.5 mol, further preferably 0.5 to 1.0 mol.

At the time of adding the reducing agent and during the reaction thereafter, the temperature is preferably maintained to 20 to 80° C. The reaction temperature is more preferably 20 to 70° C., further preferably 20 to 60° C. If the reaction temperature is 20 to 80'C., grain growth of the silver fine particles is sufficient, productivity is high and secondary aggregation is also suppressed. A time required for adding the reducing agent and the reaction thereafter depends on the scale of the reaction apparatus, and it is generally 10 minutes to 10 hours. At the time of adding the reducing agent and during the reaction thereafter, the organic solvent including an alcohol such as ethanol, propanol, butanol, etc., an ether such as propylene glycol dibutyl ether, etc., and an aromatic hydrocarbon such as toluene, etc., may be additionally added thereto depending on necessity.

A layer containing the silver fine particles can be recovered by separating a layer of the reaction product from the reaction mixture containing the silver fine particles obtained by mixing the silver salt of a carboxylic acid and the aliphatic primary amine, then, adding the reducing agent and reacting them.

The silver fine particles precipitated by the reaction has an average particle diameter of primary particles of 40 to 350 nm, a crystallite diameter of 20 to 70 nm, and a ratio of an average particle diameter of the primary particles to a crystallite diameter of the primary particles (average particle diameter/crystallite diameter) of 1 to 5.

The reaction mixture containing the silver fine particles obtained by mixing the silver salt of a carboxylic acid and the aliphatic primary amine, then, adding the reducing agent and reacting them or the layer containing the silver fine particles precipitated by the reaction may be used directly for the heat conductive paste. In the reaction mixture containing the silver fine particles or the layer containing the silver fine particles precipitated by the reaction, an unreacted aliphatic primary amine, a carboxylic acid formed by reacting the silver salt of a carboxylic acid and the reducing agent, a salt formed by reacting the carboxylic acid and the aliphatic primary amine, etc., are remained.

Silver fine particles in the reaction mixture containing the silver fine particles obtained by mixing the silver salt of a carboxylic acid and the aliphatic primary amine, then, adding the reducing agent and reacting them are precipitated and the supernatant is removed by decantation, etc., and then, the silver fine particles are taken out, and the obtained silver fine particles may be used for the heat conductive paste. At that time, an alcohol such as methanol and ethanol, etc., may be added thereto to accelerate precipitation of the silver fine particles, and depending on necessity, a silver content may be heightened by distilling methanol remained therein by an evaporator. A solvent such as dihydroterpineol and benzyl alcohol may be added to the layer containing the silver fine particles to adjust the viscosity of the paste immediately before distillation by an evaporator. A content of the silver in the layer containing the silver fine particles precipitated by the reaction is preferably 30 to 95% by mass, more preferably 50 to 92% by mass.

The solvent to be added to the layer containing the silver fine particles precipitated by the reaction may be, for example, an alcohol-based solvent such as ethylene glycol, propylene glycol, benzyl alcohol, 2-ethyl-1,3-hexane diol, dihydroterpineol, etc.;

a terpene alcohol such as terpineol, linalool, geraniol, citronellol, etc.;

an ether alcohol-based solvent such as ethylene glycol monoethyl ether, ethylene glycol monobutyl ether, propylene glycol monomethyl ether, propylene glycol monoethyl ether, propylene glycol mono-n-butyl ether, ethylene glycol monophenyl ether, propylene glycol mono-tert-butyl ether, diethylene glycol monoethyl ether, diethylene glycol monobutyl ether, dipropylene glycol monomethyl ether, dipropylene glycol monobutyl ether, tripropylene glycol monomethyl ether, etc.; and an ester-based solvent such as ethylene glycol monomethyl ether acetate, ethylene glycol monoethyl ether acetate, diethylene glycol monoethyl ether acetate, ethylene glycol monobutyl ether acetate, diethylene glycol monobutyl ether acetate, propylene glycol monomethyl ether acetate, propylene glycol monoethyl ether acetate, dipropylene glycol monoethyl ether acetate, etc., and water, etc.

The solvent to be added to the layer containing the silver fine particles may be used a single kind alone or two or more kinds in combination.

The solvent to be added to the layer containing the silver fine particles is, for example, preferably an alcohol-based solvent having a hydroxyl group and having a boiling point of 180 to 250° C., and among these, diethylene glycol monobutyl ether acetate, dihydroterpineol, benzyl alcohol, 2-ethyl-1,3-hexane diol and ethylene glycol monophenyl ether, etc., are preferred.

A content of the solvent to be added to the layer containing the silver fine particles is not particularly limited, and it is preferably 1 to 30 parts by mass based on 100 parts by mass of the silver fine particles contained in the layer containing the silver fine particles, more preferably 1 to 20 parts by mass, and further preferably 1 to 10 parts by mass.

At around the silver fine particles in the reaction mixture containing the silver fine particles obtained by reacting the silver salt of a carboxylic acid and the aliphatic primary amine, then, adding the reducing agent and reacting them or in the layer containing the silver fine particles precipitated by the reaction, the aliphatic primary amine is coordinated, and a kind of an amine complex is considered to be formed. The amines existing around the silver fine particles prevent the silver fine particles having particle sizes of submicron or less from aggregating each other, and on the other hand, the amines considered to be coordinated with the silver fine particles prevent the fusion of the silver fine particles with each other when heat is applied thereto, which is considered to be cause of lowering in thermal conductivity.

When the reaction mixture containing the silver fine particles obtained by reacting the silver salt of a carboxylic acid and the aliphatic primary amine, then, adding the reducing agent and reacting them or the layer containing the silver fine particles precipitated by the reaction is directly used for a heat conductive paste, it is preferred that the aliphatic primary amine is contained in an amount of 1 to 40 parts by mass based on 100 parts by mass of the silver fine particles contained in the reaction mixture containing the silver fine particles or the layer containing the silver fine particles precipitated by the reaction. The aliphatic primary amine in the reaction mixture containing the silver fine particles or the layer containing the silver fine particles precipitated by the reaction is more preferably contained in an amount of 1.5 to 35 parts by mass based on 101) parts by mass of the silver fine particles, further preferably 2 to 30 parts by mass, particularly preferably 2 to 20 parts by mass. If the content of the aliphatic primary amine in the reaction mixture containing the silver fine particles or the layer containing the silver fine particles precipitated by the reaction is within the above-mentioned range, the aliphatic primary amines are coordinated around the silver fine particles, whereby aggregation of the silver fine particles with each other can be prevented. The aliphatic primary amine in the reaction mixture containing the silver fine particles or the layer containing the silver fine particles precipitated by the reaction can be measured, for example, by using a gas chromatograph mass spectrograph (GCMS-QP2010 Plus) manufactured by Shimadzu Corporation shown in Examples mentioned later.

The heat conductive paste of the present invention contains the silver fine particles having specific particle characteristics, the aliphatic primary amine and the compound having a phosphoric acid group(s). The silver fine particles to be used may be the silver fine particles taken out from the reaction mixture obtained by the above-mentioned method or the silver fine particles taken out from the layer containing the silver fine particles precipitated by the reaction.

The aliphatic primary amine contained in the heat conductive paste may be the same kind of the aliphatic primary amine as the aliphatic primary amine contained in the reaction mixture containing the silver fine particles obtained by reacting the silver salt of a carboxylic acid and the aliphatic primary amine, then, adding the reducing agent and reacting them, or may be different kind of the aliphatic primary amine therefrom. In addition, the aliphatic primary amine may be a monoamine compound or a polyamine compound such as a diamine compound, etc. In the aliphatic primary amine, the aliphatic hydrocarbon group has been substituted by a hydroxyl group, an alkoxy group such as a methoxy group, an ethoxy group, a propoxy group, etc., are also included. The aliphatic primary amine is more preferably at least one kind selected from the group consisting of 2-methoxyethylamine, 3-methoxypropylamine, 3-ethoxypropylamine, 3-aminopropanol and 1,2-diaminocyclohexane. The aliphatic primary amine is further preferably at least one kind selected from the group consisting of 2-methoxyethylamine, 3-methoxypropylamine, 3-ethoxypropylamine and 1,2-diaminocyclohexane. The aliphatic primary amine is further preferably at least one kind selected from the group consisting of 3-methoxypropylamine and 1,2-diaminocyclohexane. The aliphatic primary amine is particularly preferably 3-methoxypropylamine. These may be used alone, or may be used two or more kinds in combination.

The heat conductive paste preferably contains 1 to 40 parts by mass of the aliphatic primary amine based on 100 parts by mass of the silver fine particles. The heat conductive paste more preferably contains 1.5 to 35 parts by mass of the aliphatic primary amine based on 100 parts by mass of the silver fine particles, further preferably 2 to 30 parts by mass, and particularly preferably 2 to 20 parts by mass. If the content of the aliphatic primary amine is 1 to 40 parts by mass based on 100 parts by mass of the silver fine particles in the heat conductive paste, the aliphatic primary amines are coordinated around the silver fine particles, whereby aggregation of the silver fine particles with each other can be prevented. On the other hand, the amines considered to be coordinated with the silver fine particles in the heat conductive paste prevent the fusion of the silver fine particles with each other when heat treatment of the heat conductive paste is carried out, which is considered to be cause of lowering in thermal conductivity. The aliphatic primary amine in the heat conductive paste can be measured, for example, by using a gas chromatograph mass spectrograph (GCMS-QP2010 Plus) manufactured by Shimadzu Corporation shown in Examples mentioned later.

The heat conductive paste of the present invention contains the compound having a phosphoric acid group(s) in addition to the silver fine particles having specific particle characteristics and the aliphatic primary amine.

The heat conductive paste of the present invention is obtained by mixing the compound having a phosphoric acid group(s) with the reaction mixture containing the silver fine particles which are obtained by reacting the silver salt of a carboxylic acid and the aliphatic primary amine, then, adding the reducing agent and reacting them.

While the amines contained in the heat conductive paste prevent from aggregation of the silver fine particles with each other, it is the obstacle of fusion of the silver fine particles with each other at the time of the heat treatment.

Since the heat conductive paste of the present invention contains the silver fine particles and the aliphatic primary amine as well as the compound having a phosphoric acid group(s), the airlines coordinated with the silver fine particles and the phosphoric acid groups of the compound having a phosphoric acid group(s) are reacted at the time of sintering, whereby the amines can be removed from around the silver fine particles. Since the heat conductive paste of the present invention contains the specific silver fine particles, the aliphatic primary amine and the compound having a phosphoric acid group(s), fusion of the silver fine particles with each other is promoted by the sintering at a low temperature, whereby denseness and smoothness of the silver film are ensured and thermal conductivity can be more improved. A sintering temperature is preferably 300° C. or lower, preferably 200° C. or lower, more preferably 180° C. or lower, and particularly preferably a sintering temperature at a low temperature side of 120 to 150° C.

The compound having a phosphoric acid group(s) is not particularly limited as long as it contains a phosphoric acid group(s).

The compound having a phosphoric acid group(s) is preferably at least one kind selected from the group consisting of phosphoric acid (including hypophosphoric acid, phosphorous acid and phosphonic acid), pyrophosphoric acid, polyphosphoric acid and a phosphoric acid salt thereof, and a phosphoric acid-based surfactant.

The phosphoric acid (including hypophosphoric acid, phosphorous acid and phosphonic acid), pyrophosphoric acid and a phosphoric acid salt thereof may be phosphoric acid, phosphonic acid, sodium dihydrogenphosphate, disodium hydrogenphosphate, trisodium phosphate, sodium pyrophosphate, sodium metaphosphate, potassium dihydrogenphosphate, dipotassium hydrogenphosphate, tripotassium phosphate, potassium pyrophosphate, potassium metaphosphate, ammonium dihydrogenphosphate, diammonium hydrogenphosphate, triammonium phosphate, ammonium pyrophosphate, etc.

The polyphosphoric acid to be used may be a linear condensed phosphoric acid such as tripolyphosphoric acid, tetrapolyphosphoric acid, etc., a cyclic condensed phosphoric acid such as metaphosphoric acid, hexametaphosphoric acid, etc., and a material in which such linear or cyclic condensed phosphoric acids are bonded. As a salt of these condensed phosphoric acid, an ammonium salt, a sodium salt, a potassium salt, etc., may be used.

The phosphoric acid-based surfactant is not particularly limited as long as it is a surfactant having a phosphoric acid group(s). The surfactant having a phosphoric acid group(s) may be, for example, polyoxyethylene alkylphenyl ether phosphate, polyoxyethylene alkyl ether phosphate, ammonium dipolyoxyethylene lauryl ether phosphate, ammonium dipolyoxyethylene oxypropylene lauryl ether phosphate, ammonium dipolyoxypropylene lauryl ether phosphate, dipolyoxyethylene oleyl ether phosphate, dipolyoxyethylene oxypropylene lauryl ether phosphate, dipolyoxy-propylene oleyl ether phosphate, ammonium lauryl phosphate, ammonium octyl ether phosphate, ammonium cetyl ether phosphate, polyoxyethylene lauryl ether phosphoric acid, polyoxyethylene oxypropylene lauryl ether phosphoric acid, polyoxypropylene lauryl ether phosphoric acid, polyoxyethylene tristyrylphenyl ether phosphate triethanolamine polyoxyethylene oxypropylene tristyrylphenyl ether phosphate triethanolamine, polyoxypropylene tristyrylphenyl ether phosphate triethanolamine, etc.

The surfactant having the phosphoric acid group(s) to be used may be those commercially available materials such as PHOSPHANOL (Registered Trademark) PE-510, PE-610, LB-400, EC-6103, RE-410, RS-410, RS-610, RS-710, etc., (all available from TOHO Chemical Industry Co., Ltd.), Disperbyk (Registered Trademark)-102, Disperbyk-106, Disperbyk-110, Disperbyk-111, Disperbyk-180, etc., (all available from BYK Japan KK), and the like.

The surfactant having the phosphoric acid group(s) is preferably a surfactant having an acid value in the range of 50 to 140 mg KOH/g, and an amine value in the range of substantially 0 to 100 mg KOH/g.

The compound having a phosphoric acid group(s) to be used may be a compound represented by the formula (I):

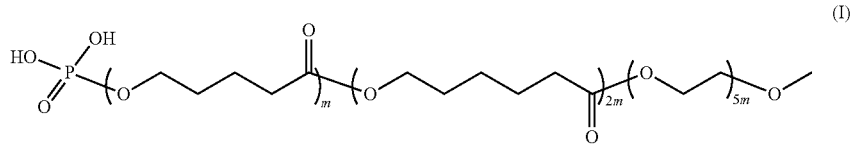

(wherein m is 1 to 10.). When the compound represented by the formula (I) is used as the compound having a phosphoric acid group(s), it may be a form of a mixture in which an amine is contained with the compound represented by the formula (I). At that time, a content of the amine is in the range which does not impair the effects of the present invention.

The compound having a phosphoric acid group(s) to be used in the heat conductive paste of the present invention may be preferably at least one kind selected from the group consisting of phosphoric acid, phosphonic acid, ammonium dihydrogenphosphate, diammonium hydrogenphosphate, triammonium phosphate, ammonium pyrophosphate, a surfactant having a phosphoric acid group(s) and the compound represented by the formula (I). The surfactant having a phosphoric acid group(s) is preferably a material having an acid value in the range of 90 to 140 mg KOH/g.

The heat conductive paste of the present invention preferably contains 100 parts by mass of the silver fine particles having specific particle characteristics, 1 to 40 parts by mass of the aliphatic primary amine and 0.001 to 2 parts by mass of the compound having a phosphoric acid group(s). The heat conductive paste of the present invention is preferably a material obtained by mixing the compound having a phosphoric acid group(s) with the reaction mixture containing the silver fine particles obtained by reacting the silver salt of a carboxylic acid and the aliphatic primary amine, then, adding the reducing agent and reacting them, the reaction mixture contains 1 to 40 parts by mass of the aliphatic primary amine based on 100 parts by mass of the silver fine particles, and the compound having a phosphoric acid group(s) is mixed with the reaction mixture in an amount of 0.001 to 2 parts by mass. The compound having a phosphoric acid group(s) contained in the heat conductive paste is more preferably 0.001 to 1.5 parts by mass, further preferably 0.001 to 1.0 part by mass, based on 100 parts by mass of the silver fine particles and 1 to 40 parts by mass of the aliphatic primary amine. In the heat conductive paste of the present invention, by containing 0.001 to 2 parts by mass of the compound having a phosphoric acid group(s) based on 100 parts by mass of the silver fine particles and 1 to 40 parts by mass of the aliphatic primary amine, the amines coordinating with the silver fine particles, which are obstacle of fusion of the silver fine particles with each other are removed from around the silver fine particles at the time of sintering, fusion of the silver fine particles with each other can be promoted by the sintering at a low temperature region, whereby denseness and smoothness of the silver film can be ensured and thermal conductivity can be more improved. If the content of the compound having a phosphoric acid group(s) in the heat conductive paste is less than 0.001 part by mass, the content of the compound having a phosphoric acid group(s) is too little, so that amities coordinated with the silver fine particles cannot sufficiently be removed from the around of the silver fine particles, whereby thermal conductivity or specific resistance is lowered in some cases. On the other hand, if the content of the compound having a phosphoric acid group(s) in the heat conductive paste exceeds 2 parts by mass, the compound having a phosphoric acid group(s) is attached to the surface of the silver fine particles from which the amines coordinating the surface thereof have been removed, and fusion of the silver fine particles with each other is rather hindered in some cases.

The heat conductive paste of the present invention contains the silver fine particles having specific particle characteristics, the aliphatic primary amine and the compound having a phosphoric acid group(s), and may further contain a binder resin. The heat conductive paste of the present invention can be obtained by mixing the compound having a phosphoric acid group(s) with the reaction mixture containing the silver fine particles obtained by reacting the silver salt of a carboxylic acid and the aliphatic primary amine, then, adding the reducing agent and reacting them, and it may further contain a binder resin. The content of the binder resin in the heat conductive paste is preferably 1 to 15 parts by mass based on 100 parts by mass of the silver fine particles, more preferably 2 to 12 parts by mass, further preferably 3 to 10 parts by mass. When the heat conductive paste contains the binder resin, printability and adhesiveness to the substrate can be improved.

The binder resin to be used in the present invention may be a thermosetting resin or a thermoplastic resin.

The thermosetting resin is not particularly limited as long as it can cure by heating and those which can be used may be, for example, an epoxy resin, an urethane resin, a vinyl ester resin, a silicone resin, a phenol resin, a urea resin, a melamine resin, an unsaturated polyester resin, a diallyl phthalate resin, a polyimide resin, etc.

The thermoplastic resin is not particularly limited as long as it can soften by heating and those conventionally known in this field can be used. There may be used, for example, a cellulose-based resin such as ethyl cellulose, nitrocellulose, etc., an acrylic resin, an alkyd resin, a saturated polyester resin, a butyral resin, polyvinyl alcohol, hydroxypropyl cellulose, etc. These binder resins may be used alone, or may be used two or more kinds in combination.

When the heat conductive paste contains a thermosetting resin, a curing agent may be further contained. The curing agent is not particularly limited as long as it can cure the thermosetting resin, and those which can be used may be, for example, a cation polymerization initiator, an amine-based curing agent, an acid anhydride curing agent, a phenol-based curing agent, etc., and a cation polymerization initiator is particularly preferred in the points that fusion of silver particles with each other proceeds and good conductivity can be obtained. These may be used alone, or may be used two or more kinds in combination.

A content of the curing agent in the heat conductive paste may largely vary depending on the kind of the curing agent or a combination with the binder resin, so that it is not particularly limited and, for example, when the binder resin in the heat conductive paste is an epoxy resin containing an ester bond and the curing agent is a cation polymerization initiator, it can preferably be 0.5 to 10 parts by mass based on 100 parts by mass of the binder resin, more preferably 2.5 to 8 parts by mass.

The heat conductive paste of the present invention may further contain a titanium coupling agent (for example, a titanate ester such as isopropyl triisostearoyl titanate, etc.), a silane coupling agent, a flame retardant, a leveling agent, a thixotropic agent, a defoaming agent, an ion scavenger, etc., in addition to the above.

The method for producing the heat conductive paste of the present invention comprises (1) a step of mixing a silver salt of a carboxylic acid and an aliphatic primary amine, (2) a step of reacting the mixture by adding a reducing agent at a reaction temperature of 20 to 80° C., (3) a step of recovering a layer containing silver fine particles by subjecting the reaction product to layer separation, and (4) a step of mixing a compound having a phosphoric acid group(s) with the recovered layer containing the silver fine particles.

In the method for producing the heat conductive paste of the present invention, an organic solvent may be present in the steps (1) to (4). Here, the organic solvent refers to an organic solvent including an alcohol such as ethanol, propanol, butanol, etc., an ether such as propylene glycol dibutyl ether, etc., and an aromatic hydrocarbon such as toluene, etc., to be added at the time of adding a reducing agent and the reaction thereafter, if necessary.

It is preferred, by the method containing the steps of (1) to (4), to obtain a heat conductive paste comprising 1 to 40 parts by mass of the aliphatic primary amine and 0.001 to 2 parts by mass of the compound having a phosphoric acid group(s) based on 100 parts by mass of the silver fine particles. In the step (3), in the layer containing the silver fine particles, which has been obtained by layer separation of the reaction product, unreacted aliphatic primary amine, a carboxylic acid formed by the reaction of the silver salt of a carboxylic acid and the reducing agent, a salt formed by the reaction of the carboxylic acid and the aliphatic primary amine, etc., are remained. The layer containing the recovered silver fine particles preferably contains 1 to 40 parts by mass of the aliphatic primary amine based on 100 parts by mass of the silver fine particles, more preferably 1.5 to 35 parts by mass, further preferably 2 to 30 parts by mass, and particularly preferably 2 to 20 parts by mass. The aliphatic primary amine in the layer containing the silver fine particles can be measured, for example, by using a gas chromatograph mass spectrograph (GCMS-QP2010 Plus) manufactured by Shimadzu Corporation shown in Examples mentioned later.

If the content of the aliphatic primary amine in the heat conductive paste is 1 to 40 parts by mass based on 100 parts by mass of the silver fine particles, the aliphatic primary amines are coordinated around the silver fine particles, whereby aggregation of the silver fine particles with each other can be prevented.

In the step (4), in the layer containing the recovered silver fine particles, 0.001 to 2 parts by mass of a compound having a phosphoric acid group(s) is preferably mixed based on 100 parts by mass of the silver fine particles contained in the layer, to obtain a heat conductive paste containing 1 to 40 parts by mass of the aliphatic primary amine and 0.001 to 2 parts by mass of the compound having a phosphoric acid group(s) based on 100 parts by mass of the silver fine particles. An amount of the compound having a phosphoric acid group(s) is more preferably 0.001 to 1.5 parts by mass, further preferably 0.001 to 1.0 part by mass based on 100 parts by mass of the silver fine particles. By containing 0.001 to 2 parts by mass of the compound having a phosphoric acid group(s), in the heat conductive paste obtained by the steps (1) to (4), amines coordinated with the silver fine particles which were obstacle of fusion of the silver fine particles with each other at the time of sintering can be removed from around the silver fine particles, fusion of the silver fine particles with each other can be promoted by the sintering at a low temperature region, denseness and smoothness of the silver film are ensured, and thermal conductivity can be more improved.

In the method for producing the heat conductive paste of the present invention, when the obtained heat conductive paste contains a binder resin or other additives such as a curing agent, etc., a step of mixing the binder resin, a curing catalyst, etc., may be contained simultaneously with the step of mixing the compound having a phosphoric acid group(s), or before or after the step.

By using the heat conductive paste of the present invention and the heat conductive paste obtained by the method for producing the same, it is printed by the conventionally known method such as screen printing, etc., to a substrate, etc., or coated, and then, sintered to form a thermally conductive film (silver film). The sintering temperature is preferably 60 to 300° C., more preferably 100 to 250° C., further preferably 120 to 200° C., and particularly preferably 120 to 180° C. In addition, the mixed silver fine particles have an average particle diameter of primary particles of 40 to 350 nm, a crystallite diameter of 20 to 70 nm and a ratio of the average particle diameter to the crystallite diameter of 1 to 5. Even when such silver fine particles having a small average particle diameter are mixed, aggregation of the silver fine particles in the heat conductive paste is suppressed, and at the time of sintering, fusion of the silver fine particles with each other is promoted, so that sinterability is improved, whereby it can respond to the demand to form a bonding member having excellent thermal conductivity while having sufficient high conductivity.

The heat conductive paste of the present invention is particularly suitable for an application as a die attach material of a semiconductor device. A lead solder has generally been used as the die attach material, but due to toxicity of lead, restriction on use of the lead is becoming more strict in the respective countries. A die attach material obtained by using the heat conductive paste of the present invention shows thermal conductivity equal to or more than the thermal conductivity (in general, 35 to 65 W/mK) of the lead solder, and conductivity thereof is good, so that it can be a die attach material having high conductivity and high thermal conductivity in place of the lead solder.

The heat conductive paste of the present invention is also suitable in an application of a bump of a semiconductor device. The heat conductive paste of the present invention is suitable as a bonding member of electronic parts such as a bump and a die attach material, etc. A semiconductor device using the heat conductive paste of the present invention as bonding parts has excellent thermal conductivity.

EXAMPLES

In the following, the present invention is explained in more detail by referring to Examples and Comparative examples. The present invention is not limited by these Examples.

[Paste Containing Silver Fine Particles (A1)]

(1) In a reaction apparatus was charged 4 kg (45 mol) of 3-methoxypropylamine, and 5 kg (30 mol) of silver acetate was added thereto under stirring while maintaining the reaction temperature to 40° C. or lower, then, the silver acetate was dissolved therein as a pale yellowish transparent solution to obtain a mixture.

(2) To the mixture was gradually added dropwise 0.7 kg (15 mol) of 95% by weight formic acid as a reducing agent, during which the reaction temperature was maintained to 30 to 40° C., the silver fine particles were being formed with the addition of the formic acid, and the pale yellowish transparent solution was gradually changed to a black liquid. Whole amount of the formic acid was added dropwise, the reaction was completed to obtain a reaction mixture.

(3) Thereafter, methanol was added to the obtained reaction mixture under stirring, then, the mixture was allowed to stand at 25° C., it was separated to two layers. The upper layer was a yellowish transparent liquid, and black silver fine particles (A1) were precipitated in the lower layer. The liquid of the upper layer was removed by decantation, and addition of methanol, allowing to stand, and decantation were repeated to recover the layer containing the silver fine particles. To the layer containing the silver fine particles was added 0.3 kg of dihydroterpineol and mixed, and the remaining methanol was distilled off by an evaporator to obtain a paste containing the silver fine particles with the silver content of 90% by mass. An amount of the 3-methoxypropylamine in the obtained paste was 2 parts by mass based on 100 parts by mass of the silver fine particles in the paste.

A content of the aliphatic primary amine in the paste containing the silver fine particles can be measured by gasifying the analytical sample in a pyrolyzer (PY-3030D) at 250° C., and injecting into a gas chromatograph mass spectrograph (GCMS-QP2010 Plus) manufactured by Shimadzu Corporation by the split method. Details of the measurement conditions are as follows.

Starting temperature: 40° C.
Retention time at starting temperature: 3 min
Temperature raising rate: 15° C./min
Termination temperature: 300° C.
Retention time at termination temperature: 10 min
Kind of column: ULTRA ALLOY-5 (manufactured by Frontier Laboratories Ltd.)
Carrier gas: Helium gas
Flow rate of carrier gas (flow amount of column): 1.78 ml/min

[Paste Containing Silver Fine Particles (A2)]

(1) In a reaction apparatus was charged 1.5 kg of toluene, and 0.9 kg (8.0 mol) of 1,2-diaminocyclohexane was added thereto, then, under stirring, 2.5 kg (15.0 mol) of silver acetate was added thereto while maintaining the reaction temperature to 45° C. or lower to obtain a mixture.

(2) After confirming that the mixture which was a reaction system became substantially uniform, 0.5 kg (10.5 mol) of formic acid was added little by little under stirring. During the addition, the reaction temperature was maintained to 40 to 45° C. to obtain a reaction mixture.

(3) Thereafter, methanol was added to the obtained reaction mixture under stirring, then, the mixture was allowed to stand at 25° C. and it was separated to two layers. The upper layer was a yellowish transparent liquid, black silver fine particles (A2) were precipitated in the lower layer. The liquid of the upper layer was removed by decantation, and addition of methanol, allowing to stand, and decantation were repeated to recover the layer containing the silver fine particles. To the layer containing the silver fine particles was added 0.15 kg of dihydroterpineol and mixed, and the remaining methanol was distilled off by an evaporator to obtain a paste containing the silver fine particles with the silver content of 90% by mass. An amount of the 1,2-diaminocyclohexane in the obtained paste was 2 parts by mass based on 100 parts by mass of the silver fine particles in the paste.

[Paste Containing Silver Fine Particles (A3)]

In the same producing method of the above-mentioned paste containing the silver fine particles (A1) except for using 2-methoxyethylamine in place of 3-methoxypropylamine as the aliphatic primary amine, a paste containing the silver fine particles (A3) was produced. The silver content in the paste was 90% by mass. An amount of the 2-methoxyethylamine in the obtained paste was 2 parts by mass based on 100 parts by mass of the silver fine particles in the paste.

[Paste Containing Silver Fine Particles (A4)]

In the same producing method of the above-mentioned paste containing the silver fine particles (A1) except for using 3-ethoxypropylamine in place of 3-methoxypropylamine as the aliphatic primary amine, a paste containing the silver fine particles (A4) was produced. The silver content in the paste was 90% by mass. An amount of the 3-ethoxypropylamine in the obtained paste was 2 parts by mass based on 100 parts by mass of the silver fine particles in the paste.

[Paste Containing Silver Fine Particles (A5)]

In the same producing method of the above-mentioned paste containing the silver fine particles (A1) except for using diethylene glycol monophenyl ether in place of dihydroterpineol as a solvent, a paste containing the silver fine particles (A5) was produced. The silver content in the paste was 90% by mass. An amount of the 3-methoxypropylamine in the obtained paste was 2 parts by mass based on 100 parts by mass of the silver fine particles in the paste.

[Paste Containing Silver Fine Particles (A6)]

In the same producing method of the above-mentioned paste containing the silver fine particles (A1) except for using ethylene glycol monophenyl ether in place of dihydroterpineol as a solvent, a paste containing the silver fine particles (A6) was produced. The silver content in the paste was 90% by mass. An amount of the 3-methoxypropylamine in the obtained paste was 2 parts by mass based on 100 parts by mass of the silver fine particles in the paste.

With regard to the silver fine particles (A1), (A2), (A3), (A4), (A5) and (A6) in the paste containing the silver fine particles, particle characteristics including an average particle diameter of the primary particles, a crystallite diameter and a ratio of the average particle diameter to the crystallite diameter (average particle diameter/crystallite diameter) were measured and evaluated. The results are shown in Table 1.

TABLE 1

| Item | | Silver fine particle (A1) | Silver fine particle (A2) | Silver fine particle (A3) | Silver fine particle (A4) | Silver fine particle (A5) | Silver fine particle (A6) |
|---|---|---|---|---|---|---|---|
| Particle characteristics | Average particle diameter (nm) | 132 | 101 | 182 | 124 | 133 | 129 |
| | Crystallite diameter (nm) | 39 | 40 | 51 | 30 | 38 | 40 |
| | Average particle diameter/ crystallite diameter | 3.4 | 2.5 | 3.6 | 4.1 | 3.5 | 3.2 |

Measurement and evaluation of the particle characteristics of the silver fine particles were carried out as follows.

Average particle diameter of primary particles: An arithmetic mean value of the diameters of the optionally selected 300 particles were obtained by the measurement using FE-SEM (JSM7500F) manufactured by JEOL Ltd., and the value was made an average particle diameter.

Crystallite diameter: A half-value width of the surface index peak of (1,1,1) plane with an Cu Kα ray as a radiation source was obtained by the measurement of an X-ray diffraction measurement device (M18XHF22) manufactured by MAC SCIENCE, and the crystallite diameter was calculated from the Scherrer's equation.

Examples 1 to 6 and 12

Ammonium hydrogen phosphate, phosphoric acid or a phosphoric acid-based surfactant (Disperbyk-180 or Disperbyk-111) was added to the paste (the silver content: 90% by mass) containing the silver fine particles (A1) obtained by the steps (1) to (3), as the compound (4) having a phosphoric acid group(s), with an amount shown in Table 2 to obtain heat conductive pastes of Example 1 to 6 and 12. In Table 2, the unit of each formulation was "parts by mass".

Disperbyk-111 as the phosphoric acid-based surfactant was a compound represented by the formula (I):

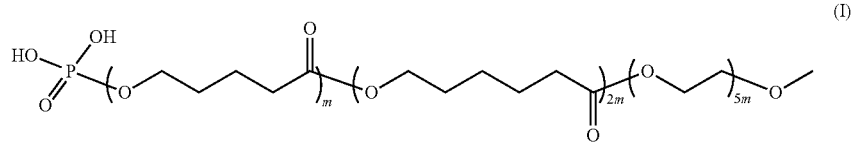

(wherein m is 1 to 10.) by the analysis using NMR. Disperbyk-180 as the phosphoric acid-based surfactant was a mixture of the compound represented by the formula (I) and an amine.

Examples 7 to 11

As mentioned above, to each of a paste (silver content: 90% by mass) containing the silver fine particles (A2), a paste (silver content: 90% by mass) containing the silver fine particles (A3), a paste (silver content: 90% by mass) containing the silver fine particles (A4), a paste (silver content: 90% by mass) containing the silver fine particles (A5), or a paste (silver content: 90% by mass) containing the silver fine particles (A6), which were obtained by the steps (1) to (3), ammonium hydrogen phosphate was added as the compound (4) having a phosphoric acid group(s) with the formulation shown in Table 2 to obtain heat conductive pastes of Examples 7 to 11, respectively. In Table 2, the unit of each formulation was "parts by mass".

Comparative Examples 1 to 4

Comparative example 1 used a paste (silver content: 90% by mass) containing the silver fine particles (A1) as a heat conductive paste. Also, in Comparative examples 2, 3 and 4, "acetic acid", "a surfactant having an amino group and having no phosphoric acid group" or "a compound having a phosphorus element and having no phosphoric acid" was added to the paste (silver content: 90% by mass) containing the silver fine particles (A1) in place of the compound having a phosphoric acid group(s) with the formulation shown in Table 2, respectively. The respective formulations of the heat conductive pastes of Comparative examples 1 to 4 are shown in Table 2.

[Electric Resistivity (Specific Resistance)/Thermal Conductivity/Film Thickness]

The heat conductive paste was coated onto a slide glass with a width of 0.5 cm, a length of 5.0 cm and a thickness of 100 μm and by using a fan dryer, heating was started from the room temperature (25° C.) with a temperature raising rate of 3° C./min. When the temperature reached to 120° C., heating was further continued for one hour while maintaining the temperature to form a silver film onto the slide glass. Thereafter, a film thickness of the obtained silver film was measured by using a surface roughness form measuring device (SURFCOM 300B) manufactured by TOKYO SEIMITSU Co., Ltd., and then, electric resistance was measured by using a multimeter (Type 2001 (memory 128K)) manufactured by TOYO Corporation with the four-terminal method. The electric resistivity (specific resistance) was obtained from the film thickness and the electric resistance of the film after curing by heating.

Evaluation of the electric resistivity (specific resistance) was made ○ when it was less than 10 μΩ·cm, and × when it was 10 μΩ·cm or more.

[Thermal Conductivity]

The heat conductive paste was coated onto the slide glass with a coating thickness of 1 to 2 mm, and in such a state, heating was started by a fan dryer from the room temperature (25° C.) with a temperature raising rate of 3° C./min, and when the temperature reached to 120° C., heating was further continued for one hour while maintaining the temperature. After completion of the heating, it was sufficiently cooled to the room temperature (25° C.), and the silver film formed onto the slide glass was peeled off from the slide glass. With regard to the thus obtained silver film, thermal conductivity was measured by the laser flash method (Xe flash analyzer manufactured by NETZSCH-Gerätebau GmbH) to obtain the value of the thermal conductivity. In general, the thermal conductivity of the lead solder is 35 to 65 W/m·K.

Evaluation of the thermal conductivity was made ○ when it was 65 W/m·K or more, and × when it was less than 65 W/m·K.

With regard to the heat conductive pastes of each of Examples and Comparative examples, evaluation of the electric resistivity (specific resistance) and evaluation of the thermal conductivity are shown in Table 2.

TABLE 2

| | | | Example 1 | Example 2 | Example 3 | Example 4 | Example 5 | Example 6 | Example 7 | Example 8 | Example 9 |
|---|---|---|---|---|---|---|---|---|---|---|---|
| Formulation (part by mass) | Silver fine particles (A1) to (A6) | Silver fine particles | (A1) 100 | (A1) 100 | (A1) 100 | (A1) 100 | (A1) 100 | (A1) 100 | (A3) 100 | (A4) 100 | (A5) 100 |
| | 3-Methoxypropylamine | Aliphatic primary amine | 2 | 2 | 2 | 2 | 2 | 2 | — | — | — |
| | 2-Methoxypropylamine | Aliphatic primary amine | — | — | — | — | — | — | 2 | — | — |
| | 1,2-Diaminocyclohexane | Aliphatic primary amine | — | — | — | — | — | — | — | 2 | — |
| | 3-Ethoxypropylamine | Aliphatic primary amine | — | — | — | — | — | — | — | — | 2 |
| | Dihydroterpineol | Solvent | 9 | 9 | 9 | 9 | 9 | 9 | 9 | 9 | 9 |
| | Diethylene glycol monobutyl ether acetate | Solvent | — | — | — | — | — | — | — | — | — |

TABLE 2-continued

| | | | | | | | | | | | |
|---|---|---|---|---|---|---|---|---|---|---|---|
| | Ethylene glycol monophenyl ether | Solvent | — | — | — | — | — | — | — | — | — |
| | Ammonium hydrophosphate | Ammonium salt of phosphoric acid | 0.001 | 0.01 | 0.05 | — | — | — | 0.05 | 0.05 | 0.05 |
| | Phosphoric acid | Phosphoric acid | — | — | — | 0.05 | — | — | — | — | — |
| | Phosphonic acid | Phosphorous acid | — | — | — | — | 0.05 | — | — | — | — |
| | Disperbyk-180 | Phosphoric acid-based surfactant | — | — | — | — | — | 0.05 | — | — | — |
| | Disperbyk-111 | Phosphoric acid-based surfactant | — | — | — | — | — | — | — | — | — |
| | Acetic acid | Organic acid | — | — | — | — | — | — | — | — | — |
| | Disperbyk-116 | Amine-based surfactant | — | — | — | — | — | — | — | — | — |
| | Ethyldiphenylphosphine | Organic phosphor compound | — | — | — | — | — | — | — | — | — |
| Evaluation and results | 120° C./1 hour curing | Specific resistance (μΩ · cm) | 6.8 | 9.1 | 8.5 | 8.2 | 8.9 | 7.1 | 6.2 | 9.8 | 8.2 |
| | | Evaluation | ○ | ○ | ○ | ○ | ○ | ○ | ○ | ○ | ○ |
| | | Thermal conductivity (μΩ · cm) | 107 | 80 | 86 | 89 | 82 | 102 | 110 | 60 | 86 |
| | | Evaluation | ○ | ○ | ○ | ○ | ○ | ○ | ○ | ○ | ○ |

| | | | Example 10 | Example 11 | Example 12 | Comparative Example 1 | Comparative Example 2 | Comparative Example 3 | Comparative Example 4 |
|---|---|---|---|---|---|---|---|---|---|
| Formulation (part by mass) | Silver fine particles (A1) to (A6) | Silver fine particles | (A5) 100 | (A6) 100 | (A1) 100 | (A1) 100 | (A1) 100 | (A1) 100 | (A1) 100 |
| | 3-Methoxypropylamine | Aliphatic primary amine | 2 | 2 | 2 | 2 | 2 | 2 | 2 |
| | 2-Methoxypropylamine | Aliphatic primary amine | — | — | — | — | — | — | — |
| | 1,2-Diaminocyclohexane | Aliphatic primary amine | — | — | — | — | — | — | — |
| | 3-Ethoxypropylamine | Aliphatic primary amine | — | — | — | — | — | — | — |
| | Dihydroterpineol | Solvent | — | — | 9 | 9 | 9 | 9 | 9 |
| | Diethylene glycol monobutyl ether acetate | Solvent | 9 | — | — | — | — | — | — |
| | Ethylene glycol monophenyl ether | Solvent | — | 9 | — | — | — | — | — |
| | Ammonium hydrophosphate | Ammonium salt of phosphoric acid | 0.05 | 0.05 | — | — | — | — | — |
| | Phosphoric acid | Phosphoric acid | — | — | — | — | — | — | — |
| | Phosphonic acid | Phosphorous acid | — | — | — | — | — | — | — |
| | Disperbyk-180 | Phosphoric acid-based surfactant | — | — | — | — | — | — | — |
| | Disperbyk-111 | Phosphoric acid-based surfactant | — | — | 0.5 | — | — | — | — |
| | Acetic acid | Organic acid | — | — | — | — | 0.5 | — | — |
| | Disperbyk-116 | Amine-based surfactant | — | — | — | — | — | 0.5 | — |
| | Ethyldiphenylphosphine | Organic phosphor compound | — | — | — | — | — | — | 0.5 |
| Evaluation and results | 120° C./1 hour curing | Specific resistance (μΩ · cm) | 8.5 | 8.8 | 6.8 | 50 | 52 | 61 | 68 |
| | | Evaluation | ○ | ○ | ○ | × | × | × | × |
| | | Thermal conductivity (μΩ · cm) | 90 | 87 | 104 | 15 | 14 | 12 | 11 |
| | | Evaluation | ○ | ○ | ○ | × | × | × | × |

As shown in Table 2, in the heat conductive pastes of Examples 1 to 12, these contain the silver fine particles having specific particle characteristics, the aliphatic primary amine and the compound having a phosphoric acid group(s) so that silver films having high conductivity and high thermal conductivity can be formed with a sintering temperature of a relatively low temperature at 120° C., that have electric resistivity (specific resistance) of 9.5 μΩ·cm or less, and thermal conductivity of 80 W/m·K or more.

In the heat conductive pastes of the present invention, by containing the silver fine particles having specific particle characteristics, the aliphatic primary amine and the compound having a phosphoric acid group(s), amines coordinated with the silver fine particles were removed from around the silver fine particles at the time of sintering, sintering of the silver fine particles with each other were promoted by the sintering of a relatively low temperature at 120° C., whereby thermal conductivity was improved.

On the other hand, in the heat conductive pastes of Comparative examples 1 to 4, silver films having electric resistivity (specific resistance) of 50 μΩ·cm or more and thermal conductivity of 15 W/m·K or less were formed with a sintering temperature of a relatively low temperature at 120° C., and no improvement in conductivity and thermal conductivity was admitted.

UTILIZABILITY IN INDUSTRY

According to the heat conductive paste of the present invention, at the time of sintering of 300° C. or lower, preferably 200° C. or lower, for example, a sintering temperature of a low temperature at 120 to 180° C., a thermally conductive film (a silver film) in which denseness or surface smoothness of the silver film is ensured, and sufficient thermal conductivity and conductivity (for example, with a sintering at 120° C., showing thermal conductivity of 80 W/m·K or more and electric resistivity (specific resistance) of 9.5 μΩ·cm or less) are shown can be formed. This is a material in which it can respond to market demand that desires to change from a flexible circuit board made of polyimide to a less expensive PET (polyethylene terephthalate) film or PEN (polyethylene naphthalate) film, etc., as a substrate in the field of mobile phones and other fields, can form a bonding part at a relatively low temperature, and, can respond to the demand to improve electric conductivity and thermal conductivity, that can be utilized as a bonding member in a semiconductor device such as a bump and a die attach material, etc., whereby it is extremely useful in industry.

The invention claimed is:

1. A heat conductive paste comprising:
   silver fine particles having an average particle diameter of primary particles of 40 to 350 nm, a crystallite diameter of 20 to 70 nm, and a ratio of the average particle diameter to the crystallite diameter of 1 to 5,
   an aliphatic primary amine, which is coordinated around the silver fine particles, and
   a compound having at least one phosphoric acid group.

2. The heat conductive paste according to claim 1, wherein the paste contains 1 to 40 parts by mass of the aliphatic primary amine and 0.001 to 2 parts by mass of the compound having at least one phosphoric acid group, based on 100 parts by mass of the silver fine particles.

3. The heat conductive paste according to claim 1, which is produced by:
   mixing a silver salt of a carboxylic acid and the aliphatic primary amine, then,
   adding a reducing agent thereto, to produce a reaction mixture containing the silver fine particles, and
   mixing the compound having at least one phosphoric acid group with the reaction mixture containing the silver fine particles.

4. The heat conductive paste according to claim 1, wherein the compound having at least one phosphoric acid group is at least one substance selected from the group consisting of a phosphoric acid, a pyrophosphoric acid, a polyphosphoric acid, a salt of a phosphoric acid, a salt of a pyrophosphoric acid, a salt of a polyphosphoric acid and a phosphoric acid-based surfactant.

5. The heat conductive paste according to claim 1, wherein the compound having at least one phosphoric acid group is a compound represented by the following formula (I):

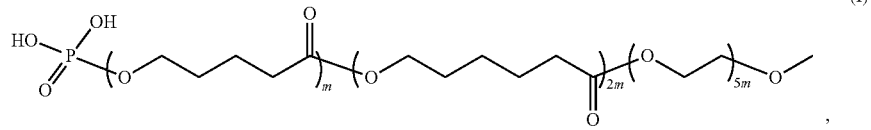

wherein m is 1 to 10.

6. The heat conductive paste according to claim 1, wherein the aliphatic primary amine is at least one aliphatic primary amine selected from the group consisting of 2-methoxyethylamine, 3-methoxypropylamine, 3-ethoxypropylamine and 1,2-diaminocyclohexane.

7. The heat conductive paste according to claim 1, wherein the aliphatic primary amine is at least one aliphatic primary amine selected from the group consisting of 3-methoxypropylamine and 1,2-diaminocyclohexane.

8. The heat conductive paste according to claim 1, which is for die attachment of a semiconductor device.

9. The heat conductive paste according to claim 1, which is for formation of a bump of a semiconductor device.

10. A semiconductor device comprising the heat conductive paste according to claim 1 for bonding parts.

11. A method for producing a heat conductive paste comprising the steps of:
    (1) mixing a silver salt of a carboxylic acid and an aliphatic primary amine to form a mixture,
    (2) adding a reducing agent to the mixture of step (1) at a reaction temperature of 20 to 80° C. to form a reaction mixture,
    (3) separating layers of the reaction mixture of step (2) and recovering a layer containing silver fine particles with the aliphatic primary amine, which is coordinated around the silver fine particles, and
    (4) mixing a compound having at least one phosphoric acid group with the layer containing the silver fine particles and the aliphatic primary amine coordinated around the silver fine particles.

12. The method for producing a heat conductive paste according to claim 11, wherein a heat conductive paste containing 1 to 40 parts by mass of the aliphatic primary amine and 0.001 to 2 parts by mass of the compound having at least one phosphoric acid group, based on 100 parts by mass of the silver fine particles, is obtained.

13. The heat conductive paste according to claim 2, wherein the compound having at least one phosphoric acid group is at least one substance selected from the group consisting of a phosphoric acid, a pyrophosphoric acid, a polyphosphoric acid, a salt of a phosphoric acid, a salt of a pyrophosphoric acid, a salt of a polyphosphoric acid and a phosphoric acid-based surfactant.

14. The heat conductive paste according to claim 2, wherein the compound having at least one phosphoric acid group is a compound represented by the following formula (I):

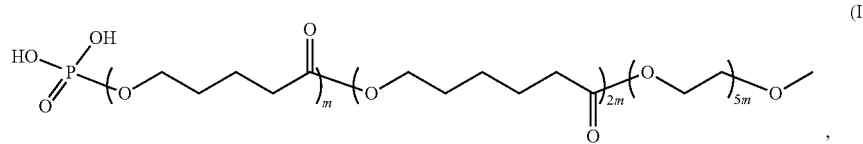

(I)

wherein m is 1 to 10.

15. The heat conductive paste according to claim 2, wherein the aliphatic primary amine is at least one aliphatic primary amine selected from the group consisting of 2-methoxyethylamine, 3-methoxypropylamine, 3-ethoxypropylamine and 1, 2-diaminocyclohexane.

16. The heat conductive paste according to claim 2, wherein the aliphatic primary amine is at least one aliphatic primary amine selected from the group consisting of 3-methoxypropylamine and 1, 2-diaminocyclohexane.

17. The method for producing a heat conductive paste according to claim 11, wherein the reducing agent is at least one reducing agent selected from a group consisting of formic acid, formaldehyde, ascorbic acid and hydrazine.

18. The method for producing a heat conductive paste according to claim 11, wherein the silver salt of a carboxylic acid is at least one silver salt of a carboxylic acid, wherein the carboxylic acid is selected from a group consisting of acetic acid and propionic acid.

* * * * *